(12) United States Patent
Kobayashi

(10) Patent No.: US 11,127,349 B2
(45) Date of Patent: Sep. 21, 2021

(54) DISPLAY DEVICE AND METHOD FOR DRIVING SAME

(71) Applicant: SHARP KABUSHIKI KAISHA, Sakai (JP)

(72) Inventor: Fumiyuki Kobayashi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/981,961

(22) PCT Filed: Apr. 27, 2018

(86) PCT No.: PCT/JP2018/017255
§ 371 (c)(1),
(2) Date: Sep. 17, 2020

(87) PCT Pub. No.: WO2019/207782
PCT Pub. Date: Oct. 31, 2019

(65) Prior Publication Data
US 2020/0410933 A1     Dec. 31, 2020

(51) Int. Cl.
*G09G 5/10* (2006.01)
*G09G 3/3233* (2016.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC ......... G09G 3/3233; G09G 2300/0819; G09G 3/3266; G09G 2320/045;
(Continued)

(56) References Cited

U.S. PATENT DOCUMENTS 9,240,139 B2 *  1/2016  Kim ..................... G09G 3/3233
9,549,450 B2 *  1/2017  Kim ..................... G09G 3/3241
(Continued)

FOREIGN PATENT DOCUMENTS

JP      2016-109772 A    6/2016
JP      2016-110055 A    6/2016

*Primary Examiner* — Duc Q Dinh
(74) *Attorney, Agent, or Firm* — ScienBiziP, P.C.

(57) ABSTRACT

A pixel circuit of a display device includes an electro-optical element, a drive transistor, a first transistor including a first conduction terminal connected to an anode terminal of the electro-optical element, a second conduction terminal to which an initialization voltage is applied, and a gate terminal connected to a scanning line, a second transistor including a first conduction terminal connected to a gate terminal of the drive transistor and a gate terminal connected to an immediately preceding scanning line selected in a horizontal interval immediately before the scanning line is selected, and a third transistor being diode-connected and including a drain terminal and a gate terminal to which an initialization voltage is applied and a source terminal connected to a second conduction terminal of the second transistor. Thus, a display device that can suppress both the bright spots and the black floating is provided.

20 Claims, 17 Drawing Sheets

(51) Int. Cl.
　　　*G09G 3/3266*　　(2016.01)
　　　*G09G 3/3275*　　(2016.01)
　　　*H01L 27/15*　　(2006.01)
　　　*H01L 27/32*　　(2006.01)

(52) U.S. Cl.
　　　CPC .............. *G09G 2300/0809* (2013.01); *G09G 2320/0233* (2013.01); *H01L 27/156* (2013.01); *H01L 27/3276* (2013.01)

(58) Field of Classification Search
　　　CPC ..... G09G 2310/0251; G09G 2320/043; G09G 3/3291; G09G 3/3275; G09G 2300/0809; G09G 2320/0238; G09G 2310/0286; G09G 2310/06; G09G 3/3208; G09G 3/325; G09G 2300/0876; G09G 2310/0264; H01L 27/3262; H01L 27/3248
　　　See application file for complete search history.

(56) References Cited

U.S. PATENT DOCUMENTS

| | | | |
|---|---|---|---|
| 9,576,532 B2* | 2/2017 | Lee | .................... G09G 3/3233 |
| 2016/0155379 A1 | 6/2016 | Na | |

* cited by examiner

Prior Art

DISPLAY DEVICE AND METHOD FOR DRIVING SAME

TECHNICAL FIELD

The disclosure relates to a display device, and more particularly, to a display device including a pixel circuit including an electro-optical element.

BACKGROUND ART

Organic Electro Luminescence (hereinafter referred to as "EL") display devices including pixel circuits including organic EL elements have recently been coming into practical use. The pixel circuit of the organic EL display device includes a drive transistor, a writing control transistor, and the like in addition to the organic EL element. A Thin Film Transistor (hereinafter referred to as a TFT) is used in these transistors. The organic EL element is a kind of electro-optical element and emits light at brightness according to the amount of flowing current. The drive transistor is provided in series with the organic EL element, and controls the amount of current flowing through the organic EL element.

Variation and fluctuation occur in characteristics of the organic EL element and the drive transistor. Thus, variation and fluctuation in characteristics of these elements need to be compensated in order to perform higher picture quality display in the organic EL display device. For the organic EL display device, a method for compensating the characteristics of the elements inside the pixel circuits and a method for compensating the characteristics of the elements outside the pixel circuit are known. In the organic EL display device, processing of initializing a gate terminal of the drive transistor may be performed before a voltage (hereinafter referred to as a data voltage) according to an image signal is written to the pixel circuit.

For the organic EL display device, many pixel circuits have been proposed. For example, the pixel circuit 95 including seven TFTs: M91 to M97 and an organic EL element L9 illustrated in FIG. 11 is known. The TFT: M91 is turned on in a horizontal interval immediately before a horizontal interval at which a data voltage is written to the pixel circuit 95. At this time, a gate terminal of the TFT: M94 (drive transistor) is initialized by using an initialization voltage Vini. The TFT: M97 is turned on in a horizontal interval at which the data voltage is written to the pixel circuit 95. At this time, an anode terminal of the organic EL element L9 is initialized by using the initialization voltage Vini. In addition, pixel circuits of an organic EL display device having an initialization function are described in PTLS 1 and 2, for example.

CITATION LIST

Patent Literature

PTL 1: JP 2016-109772 A
PTL 2: JP 2016-110055 A

SUMMARY

Technical Problem

In the display device including the pixel circuit 95 illustrated in FIG. 11 (hereinafter, referred to as a known display device), the gate terminal of the TFT: M94 and the anode terminal of the organic EL element L9 are initialized by using the same initialization voltage Vini. As a result, there is a problem in the known display device that bright spots and black floating are prone to occur. Reasons for this will be described below.

In a case where the organic EL element L9 is turned off during the light emission period of the organic EL element L9, a high data voltage to turn off the TFT: M94 is applied to the gate terminal of the TFT: M94. However, in a case where the initialization voltage Vini is low, a drain-source voltage of the TFT: M91 increases, and the leakage current flowing through the TFT: M91 increases. Thus, the gate voltage of the TFT: M94 is reduced, and current flows through the TFT: M94, and the organic EL element L9 emits light. As a result, the bright spots occur in a display screen.

FIG. 12 is a diagram showing a measurement result of brightness near the bright spots in the known display device. The brightness shown in FIG. 12 is preferably always low. The actual brightness, however, is low at the start of the light emission period, and then gradually increases. FIG. 12 shows a change in brightness in a case where the initialization voltage Vini is a relatively low voltage V11 and a change in brightness in a case where the initialization voltage Vini is a relatively high voltage V12. The change in brightness is smaller in the latter. Thus, to suppress the generation of the bright spots, the initialization voltage Vini is preferably increased.

However, in a case where the initialization voltage Vini is increased, the voltage (Vini–ELVSS) applied to the organic EL element L9 during the non-light emission period of the organic EL element L9 is increased, and may exceed a light emission threshold voltage of the organic EL element L9. As a result, a current flows through the organic EL element L9, and the organic EL element L9 emits faint light. As a result, the black floating occurs in the display screen.

FIG. 13 is a diagram showing a measurement result of the brightness of a pixel in a case where the black floating occurs in the known display device. The brightness shown in FIG. 13 is also preferably always low. The actual brightness, however, is increased in the non-light emission period (the period indicated by the dashed lines). FIG. 13 shows a change in brightness in a case where the initialization voltage Vini is from V21 to V24 (where V21<V22<V23<V24). The change in brightness is smaller as the initialization voltage Vini is lower. Thus, to suppress the generation of the black floating, the initialization voltage Vini is preferably lowered.

In this way, in the known display device, in a case where the generation of the bright spots is suppressed by increasing the initialization voltage Vini, the black floating occurs, whereas in a case where the generation of the black floating is suppressed by lowering the initialization voltage Vini, the bright spots occur. As a result, depending on the initialization voltage Vini, either the bright spots or the black floating is prone to occur.

Thus, an object is to provide a display device that can suppress both the bright spots and the black floating.

Solution to Problem

The above-described problem can be solved by a display device, for example, including: a display portion including a plurality of scanning lines, a plurality of data lines, and a plurality of pixel circuits two-dimensionally arranged; a scanning line drive circuit configured to drive the plurality of scanning lines; and a data line drive circuit configured to drive the plurality of data lines, wherein each of the plurality of pixel circuits includes an electro-optical element provided on a path connecting a first conductive member and a second conductive member for supplying a power supply voltage and configured to emit light at brightness according to a current flowing through the path, a drive transistor provided in series with the electro-optical element on the path and configured to control the amount of current flowing through the path, a first transistor including a first conduction terminal connected to an anode terminal of the electro-optical element, a second conduction terminal to which an initialization voltage is applied, and a gate terminal connected to a scanning line of the plurality of scanning lines, a second transistor including a first conduction terminal connected to a gate terminal of the drive transistor and a gate terminal connected to an immediately preceding scanning line selected in a horizontal interval immediately before the scanning line is selected, and a third transistor being diode-connected and including a drain terminal and a gate terminal to which the initialization voltage is applied, and a source terminal connected to a second conduction terminal of the second transistor.

The above-described problem can also be solved by a method for driving a display device including the display portion described above, the method including initializing the gate terminal of the drive transistor by turning on the second and third transistors, initializing the anode terminal of the electro-optical element by turning on the first transistor, and applying a voltage according to an image signal to the gate terminal of the drive transistor by driving a scanning line of the plurality of scanning lines and a data line of the plurality of data lines.

Advantageous Effects of Disclosure

According to the display device and the driving method of the same described above, both the bright spots and the black floating can be suppressed by initializing the gate terminal of the drive transistor and the anode terminal of the electro-optical element to the different voltage levels. An increase in the layout area of the display portion can be prevented, by initializing the gate terminal of the drive transistor and the anode terminal of the electro-optical element by using the same wiring line.

DESCRIPTION OF EMBODIMENTS

Hereinafter, a display device according to each embodiment will be described with reference to drawings. The display device according to each embodiment is an organic EL display device including a pixel circuit including an organic EL element. The organic EL element is a kind of electro-optical element, and is also called an organic light emitting diode or an OLED. In the following description, the horizontal direction of the drawings is referred to as the row direction, and the vertical direction of the drawings is referred to as the column direction. m and n represent integers greater than or equal to 2, i represents an integer greater than or equal to 1 and less than or equal to m, and j represents an integer greater than or equal to 1 and less than or equal to n.

First Embodiment

Figure 1:
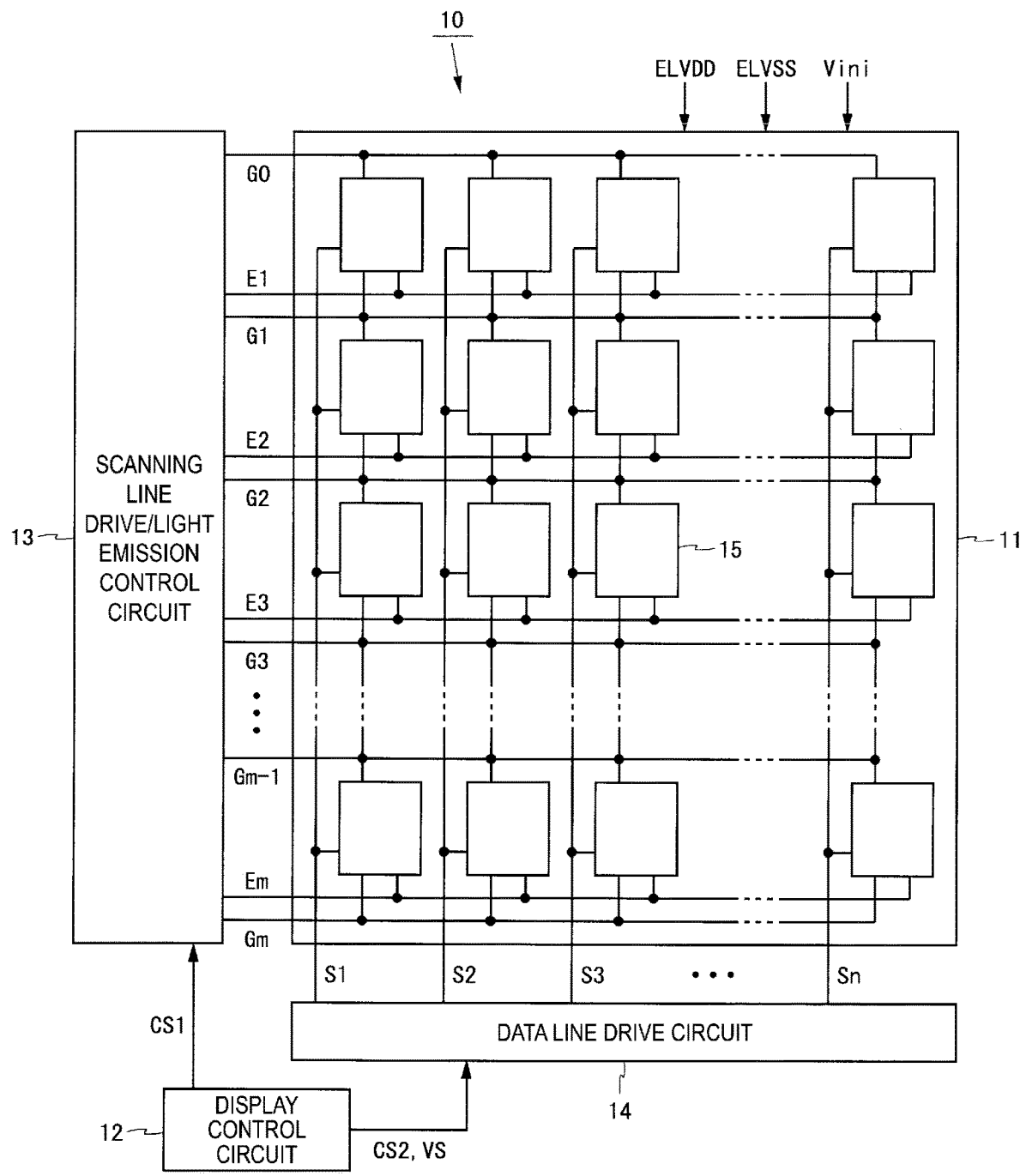
FIG. 1 is a block diagram illustrating a configuration of a display device according to a first embodiment.

FIG. 1 is a block diagram illustrating a configuration of a display device according to a first embodiment. A display device 10 illustrated in FIG. 1 includes a display portion 11, a display control circuit 12, a scanning line drive/light emission control circuit 13, and a data line drive circuit 14. The scanning line drive/light emission control circuit 13 is a circuit combining a scanning line drive circuit with a light emission control circuit.

The display portion 11 includes (m+1) scanning lines G0 to Gm, n data lines S1 to Sn, m light emission control lines E1 to Em, and (m×n) pixel circuits 15. The scanning lines G0 to Gm extend in the row direction and are arranged parallel to each other. The data lines S1 to Sn extend in the column direction and are arranged orthogonal to the scanning lines G0 to Gm and parallel to each other. The light emission control lines E1 to Em extend in the row direction and are arranged parallel to the scanning lines G0 to Gm. The scanning lines G1 to Gm and the data lines S1 to Sn intersect at (m×n) locations. The (m×n) pixel circuits 15 are each two-dimensionally arranged corresponding to each intersection point between the scanning lines G1 to Gm and the data lines S1 to Sn. The pixel circuit 15 in the i-th row and j-th column is connected to two scanning lines Gi−1 and Gi, a data line Sj, and a light emission control line Ei. Each of the plurality of pixel circuits 15 is constantly supplied with voltages (a high-level power supply voltage ELVDD, a low-level power supply voltage ELVSS, and an initialization voltage Vini) of three kinds by using a conductive member (a wiring line or an electrode) (not illustrated).

The display control circuit 12 outputs a control signal CS1 to the scanning line drive/light emission control circuit 13, and outputs a control signal CS2 and an image signal VS to the data line drive circuit 14. The scanning line drive/light emission control circuit 13 drives the scanning lines G0 to Gm and the light emission control lines E1 to Em on the basis of the control signal CS1. The data line drive circuit 14 drives the data lines S1 to Sn on the basis of the control signal CS2 and the image signal VS. More specifically, the scanning line drive/light emission control circuit 13 sequentially selects one of the scanning lines G0 to Gm on the basis of the control signal CS1 and applies an active-level voltage (the low-level voltage) to the selected scanning line. The n pixel circuits 15 connected to the selected scanning line are collectively selected as a result. The data line drive circuit 14 applies n data voltages according to the image signal VS to the data lines S1 to Sn on the basis of the control signal CS2. n data voltages are written to the selected n pixel circuits 15, respectively, as a result. The scanning line drive/light emission control circuit 13 applies to the light emission control line Ei, a voltage (the high-level voltage) indicating the non-emitting in a period including a select period of the pixel circuits 15 in the (i−1)-th row and the i-th row, and a voltage (the low-level voltage) indicating the light emission in the other period. The organic EL element in the pixel circuit 15 in the i-th row emits light at a brightness according to the data voltage written to the pixel circuit 15 while the voltage of the light emission control line Ei is at the low-level.

Figure 2:
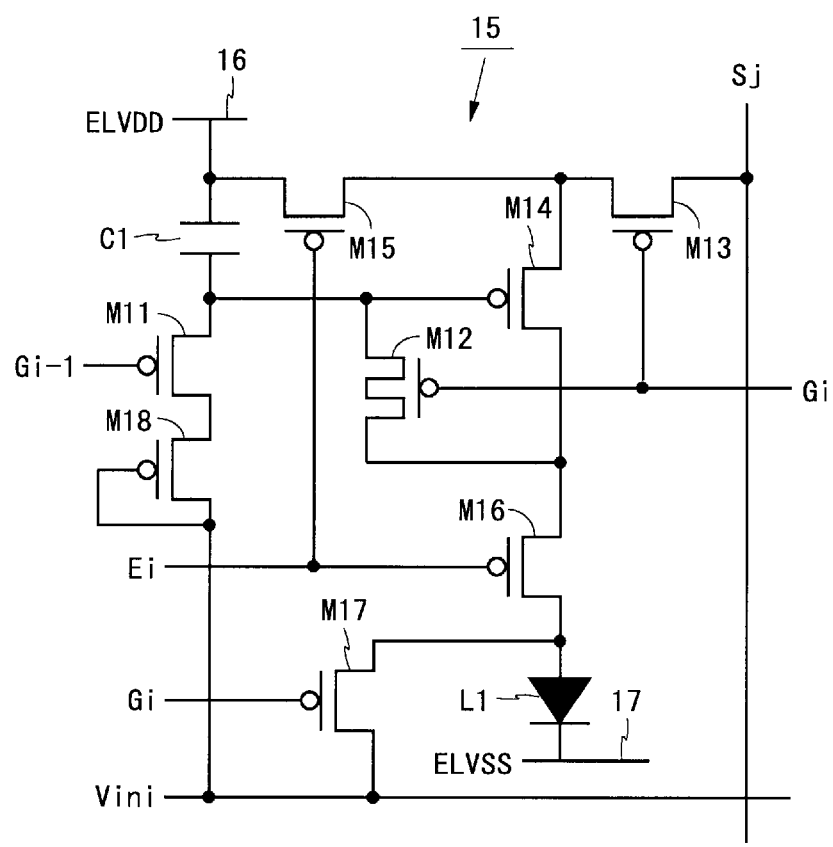
FIG. 2 is a circuit diagram illustrating a pixel circuit of the display device illustrated in FIG. 1.

FIG. 2 is a circuit diagram illustrating the pixel circuit 15. FIG. 2 illustrates a pixel circuit 15 in the i-th row and j-th column. A pixel circuit 15 illustrated in FIG. 2 includes eight TFTs: M11 to M18, an organic EL element L1, and a capacitor C1. TFTs: M11 to M18 are P-channel transistors, and a TFT: M12 is a double gate transistor having two gate terminals. Note that the TFT: M12 may be a single gate transistor having one gate terminal. Hereinafter, a power source wiring line for the high-level power supply voltage ELVDD is referred to as a first power source wiring line 16 and a power source wiring line for the low-level power supply voltage ELVSS is referred to as a second power source wiring line 17.

Note that, a TFT included in the pixel circuit 15 may be an amorphous silicon transistor including a channel layer made of amorphous silicon, a low-temperature polysilicon transistor including a channel layer made of low-temperature polysilicon, or an oxide semiconductor transistor including a channel layer formed of an oxide semiconductor. For example, Indium-Gallium-Zinc Oxide (referred to as IGZO) may be used as the oxide semiconductor. A TFT included in the pixel circuit 15 may be a top gate type or a bottom gate type. A pixel circuit including an N-channel transistor may also be used instead of the pixel circuit 15 including the P-channel transistor. In a case of configuring the pixel circuit using the N-channel transistor, the polarity of the signal and the power supply voltage supplied to the pixel circuit may be reversed.

A source terminal of the TFT: M15 and one electrode (an upper electrode in FIG. 2) of the capacitor C1 are connected to the first power source wiring line 16. A first conduction terminal (a right terminal in FIG. 2) of the TFT: M13 is connected to the data line Sj. A drain terminal of the TFT: M15 and a second conduction terminal of the TFT: M13 are connected to a source terminal of the TFT: M14. A drain terminal of the TFT: M14 is connected to a first conduction terminal of the TFT: M12 (a lower terminal in FIG. 2) and a source terminal of the TFT: M16. A drain terminal of the TFT: M16 is connected to an anode terminal of the organic EL element L1 and a source terminal of the TFT: M17. A cathode terminal of the organic EL element L1 is connected to the second power source wiring line 17. A second conduction terminal of the TFT: M12 is connected to a gate terminal of the TFT: M14, the other electrode of the capacitor C1, and a first conduction terminal (an upper terminal in FIG. 2) of the TFT: M11. A second conduction terminal of the TFT: M11 is connected to a source terminal of the TFT: M18. The initialization voltage Vini is applied to drain terminals of the TFTs: M17, M18 and a gate terminal of the TFT: M18. Gate terminals of the TFTs: M12, M13, and M17 are connected to the scanning line Gi, and gate terminals of the TFTs: M15 and M16 are connected to the light emission control line Ei. The gate terminal of the TFT: M11 is connected to an immediately preceding scanning line Gi−1 selected during a horizontal interval before a period at which the scanning line Gi is selected. Since the drain terminal and the gate terminal of the TFT: M18 are connected to each other, the TFT: M18 is diode-connected.

In the pixel circuit 15, the organic EL element L1 is provided on a path connecting a first and a second conductive members (the first power source wiring line 16 and the second power source wiring line 17) for supplying a power supply voltage, and functions as an electro-optical element that emits light at brightness according to a current flowing through the path. The TFT: M14 is provided in series with the electro-optical element on the path and functions as a drive transistor that controls the amount of current flowing through the path. The TFT: M17 functions as a first transistor that includes a first conduction terminal connected to an anode terminal of the electro-optical element, a second conduction terminal to which the initialization voltage Vini is applied, and a gate terminal connected to the scanning line Gi. The TFT: M11 functions as a second transistor that includes a first conduction terminal connected to a gate terminal of the drive transistor and a gate terminal connected to the immediately preceding scanning line Gi−1 selected in a horizontal interval immediately before the scanning line Gi is selected. The TFT: M18 is diode-connected and functions as a third transistor that includes a drain terminal and a gate terminal to which an initialization voltage Vini is applied, and a source terminal connected to a second conduction terminal of the second transistor.

The TFT: M13 functions as a writing control transistor that includes a first conduction terminal connected to the data line Sj, a second conduction terminal connected to a first conduction terminal of the drive transistor, and a gate terminal connected to the scanning line Gi. The TFT: M12 functions as a threshold value compensation transistor that includes a first conduction terminal connected to a second conduction terminal of the drive transistor, a second conduction terminal connected to the gate terminal of the drive transistor, and a gate terminal connected to the scanning line Gi. The TFT: M15 functions as a first light emission control transistor that includes a first conduction terminal connected to the first conductive member, a second conduction terminal connected to the first conduction terminal of the drive transistor, and a gate terminal connected to the light emission control line Ei. The TFT: M16 functions as a second light emission control transistor that includes a first conduction terminal connected to the second conduction terminal of the drive transistor, a second conduction terminal connected to the anode terminal of the electro-optical element, and a gate terminal connected to the light emission control line Ei. The capacitor C1 is provided between the first conductive member and the gate terminal of the drive transistor. The electro-optical element includes a cathode terminal connected to the second conductive member.

Figure 3:
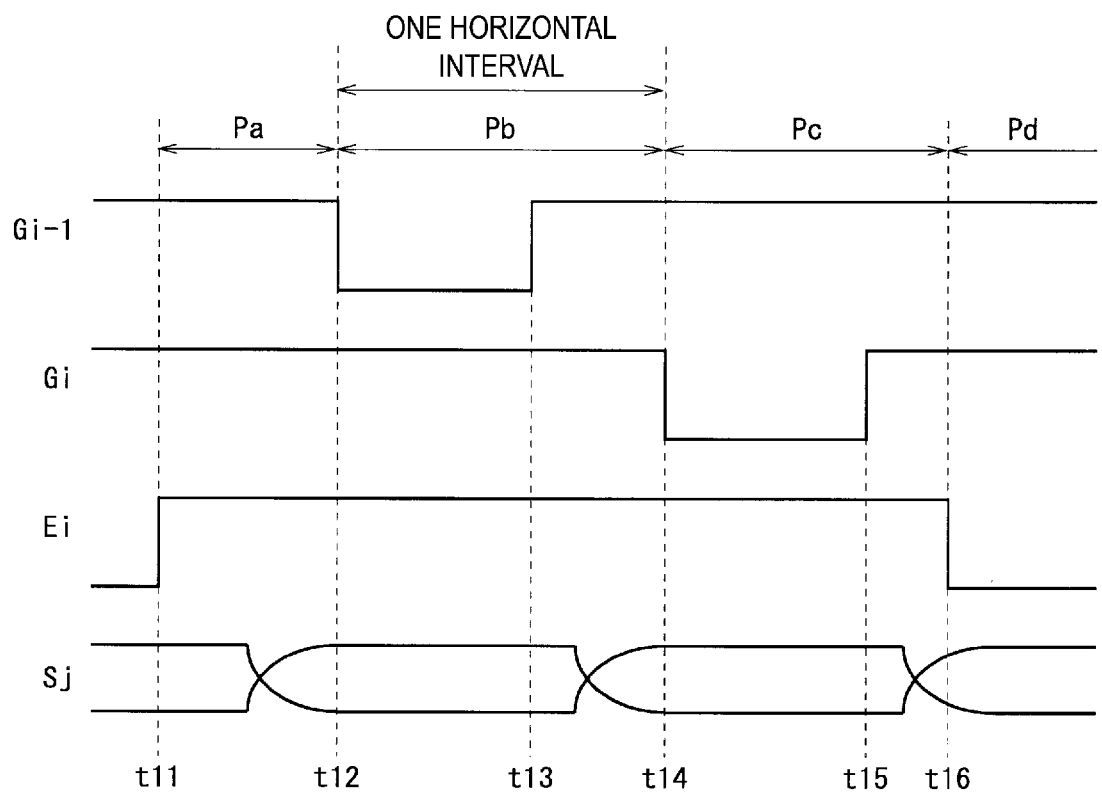
FIG. 3 is a timing chart of the display device illustrated in FIG. 1.

FIG. 3 is a timing chart of the display device 10. FIG. 3 illustrates a change in voltage in a case where a data voltage is written to the pixel circuit 15 in the i-th row and j-th column. In FIG. 3, the periods Pa to Pd are an emission stop period, a drive transistor initialization period, a write period, and a light emission period, respectively, of the pixel circuit 15 in the i-th row. In the write period, the threshold value compensation for the TFT: M14 and the initialization of the organic EL element L1 are also performed. The length of the period Pb is equal to the length of one horizontal interval. Hereinafter, signals on the scanning lines Gi−1 and Gi are respectively referred to as scanning signals Gi−1 and Gi, and a signal on the light emission control line Ei is referred to as a light emission control signal Ei.

FIGS. 4A to 4D are diagrams illustrating actions of the pixel circuit 15 in the i-th row and j-th column in the periods Pa to Pd, respectively. FIGS. 4A to 4D describe voltages supplied from the outside of the pixel circuit 15, voltages at nodes in the pixel circuit 15, and currents flowing in the pixel circuit 15. Note that the voltages illustrated in the diagrams are merely examples for facilitating the understanding of the actions of the pixel circuit 15. The voltages supplied from the outside of the pixel circuit 15 and the voltages at the nodes in the pixel circuit 15 may be voltages other than that illustrated in the diagrams.

Before a time t1, the scanning signals Gi−1 and Gi are at the high-level, and the light emission control signal Ei is at the low-level. Thus, the TFTs: M15 and M16 are in an on state, and the TFTs: M11 to M13, M17 and M18 are in an off state. At this time, in a case where a gate-source voltage of the TFT: M14 is less than or equal to a threshold voltage, a current flows from the first power source wiring line 16 toward the second power source wiring line 17 via the TFTs: M15, M14, and M16 and the organic EL element L1, and the organic EL element L1 emits light at brightness according to the amount of the flowing current.

Figure 4A:
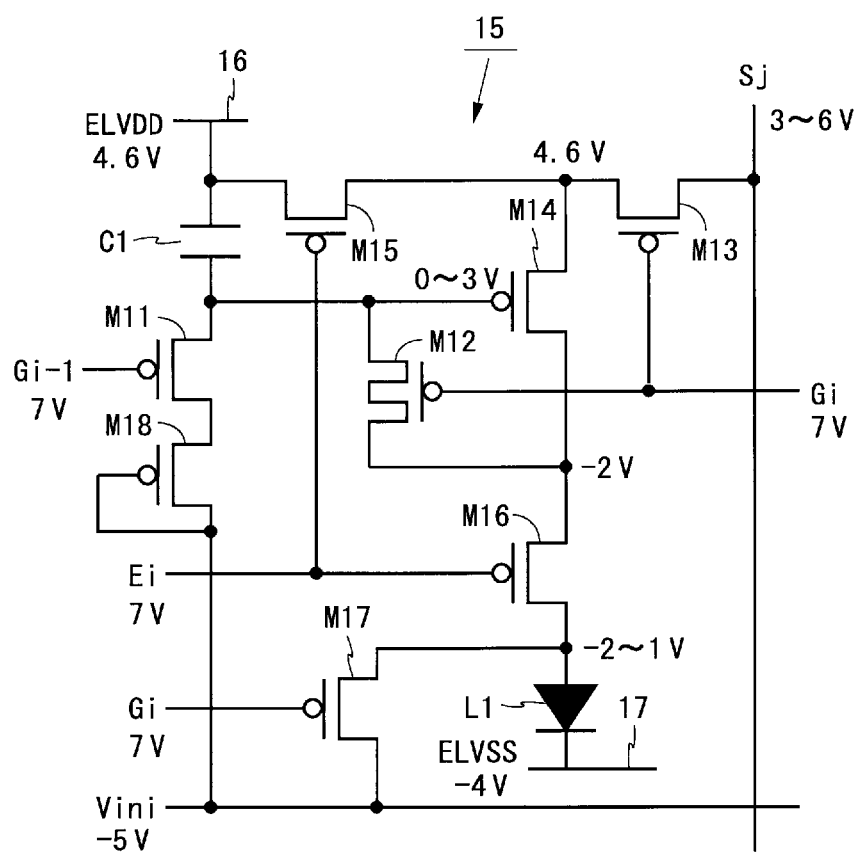
FIG. 4A is a view for describing an action of the pixel circuit illustrated in FIG. 2.

At the time t1, the light emission control signal Ei is changed to the high-level. Accordingly, the TFTs: M15 and M16 are turned off. Thus, no current flows via the organic EL element L1 at and after the time t11, and the organic EL element L1 is brought into a non-emitting state (FIG. 4A).

Figure 4B:
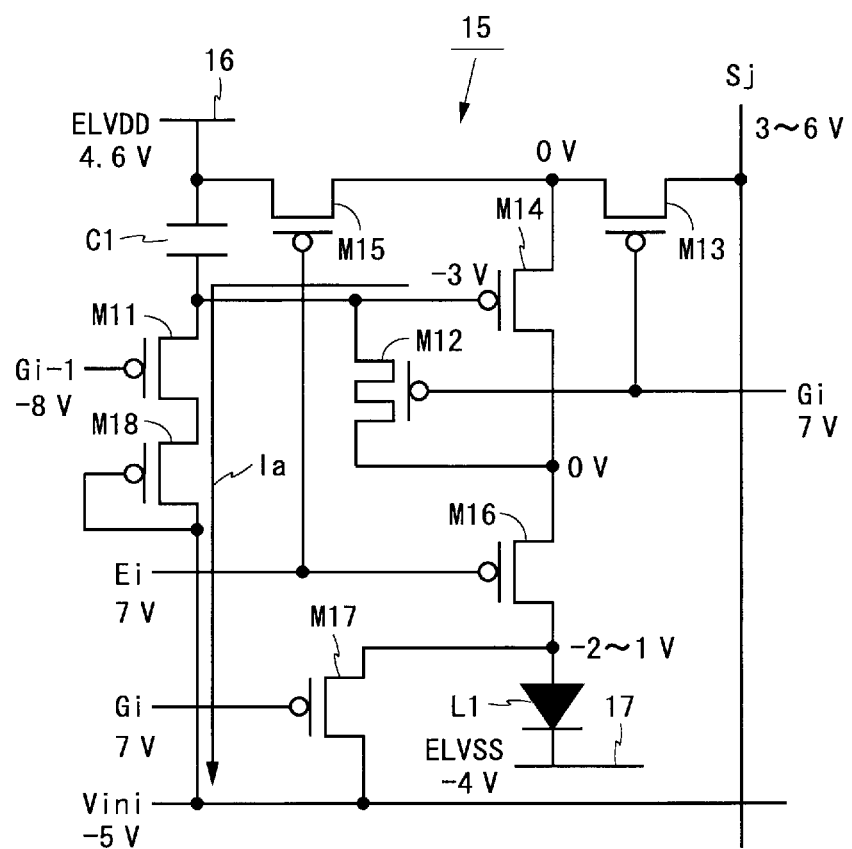
FIG. 4B is a continuation of FIG. 4A.

Next, at a time t12, the scanning signal Gi−1 is changed to the low-level. Accordingly, the TFT: M11 is turned on, and the TFT: M18 is also turned on. Thus, the current Ia flows from the gate terminal of the TFT: M14 toward the wiring line applied with the initialization voltage Vini via the TFTs: M11 and M18, and the gate terminal of the TFT: M14 is initialized by using the initialization voltage Vini (FIG. 4B). Given that the threshold voltage of the TFT: M18 is VthA (<0), the gate voltage of the TFT: M14 after the initialization is (Vini+|VthA|). The initialization voltage Vini is set at a lower level such that the TFT: M14 is turned on immediately after the scanning signal Gi is changed to the low-level (immediately after a time t14).

Next, at a time t13, the scanning signal Gi−1 is changed to the high-level. Accordingly, the TFT: M11 is turned off, and the TFT: M18 is also turned off. At the time t13, the initialization of the gate terminal of the TFT: M14 terminates.

Figure 4C:
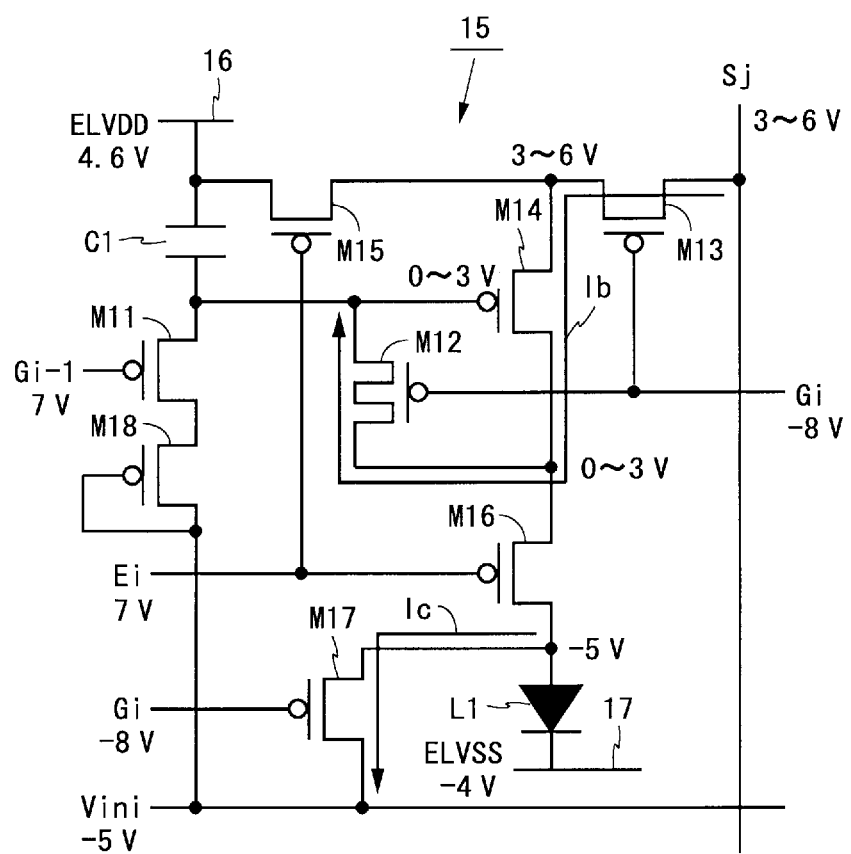
FIG. 4C is a continuation of FIG. 4B.

Next, at the time t14, the scanning signal Gi is changed to the low-level. Accordingly, the TFTs: M12, M13, and M17 are turned on. At and after the time t14, the gate terminal and the drain terminal of the TFT: M14 are electrically connected to each other via the TFT: M12 in an on state, and thus the TFT: M14 is in a diode-connected state. Thus, a current Ib flows from the data line Sj toward the gate terminal of the TFT: M14 via the TFTs: M13, M14, and M12 (FIG. 4C). The gate voltage of the TFT: M14 increases due to the current Ib. In a case where a gate-source voltage of the TFT: M14 is equal to a threshold voltage of the TFT: M14, the current Ib does not flow. Given that a threshold voltage of the TFT: M14 is VthB (<0) and a data voltage applied to the data line Sj in a period from the time t14 to a time t15 is Vd, a gate voltage of the TFT: M14 after a lapse of sufficient time from the time t14 is (Vd−|VthB|).

At and after the time t14, a current Ic flows from the anode terminal of the organic EL element L1 toward the wiring line applied with the initialization voltage Vini via the TFT: M17, and the anode terminal of the organic EL element L1 is initialized by using the initialization voltage Vini. The anode voltage of the organic EL element L1 after the initialization is Vini.

Next, at the time t15, the scanning signal Gi is changed to the high-level. Accordingly, the TFTs: M12, M13, and M17 are turned off. At time t15, initialization of the anode terminal of the organic EL element L1 terminates. At and after the time t15, the capacitor C1 holds an inter-electrode voltage (ELVDD−Vd+|VthB|).

Figure 4D:
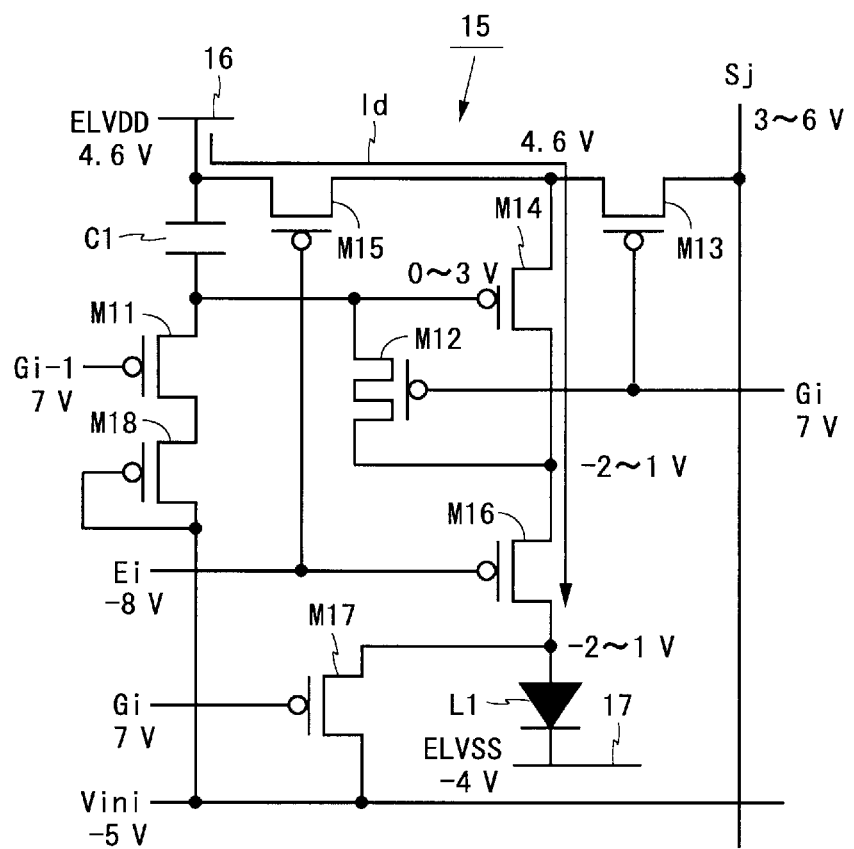
FIG. 4D is a continuation of FIG. 4C.

Next, the light emission control signal Ei is changed to the low-level at a time t16. Accordingly, the TFTs: M15 and M16 are turned on. At and after the time t16, a current Id flows from the first power source wiring line 16 toward the second power source wiring line 17 via the TFTs: M15, M14, M16 and the organic EL element L1 (FIG. 4D). A gate-source voltage Vgs of the TFT: M14 is held at (ELVDD−Vd+|VthB|) by action of the capacitor C1. The current Id flowing at and after the time t16 is, therefore, given by Equation (1) below by using a constant K.

$$Id = K(Vgs - |VthB|)^2 \quad (1)$$
$$= K(ELVDD - Vd + |VthB| - |VthB|)^2$$
$$= K(ELVDD - Vd)^2$$

In this way, at and after the time t16, the organic EL element L1 emits light at brightness according to the data voltage Vd written to the pixel circuit 15 regardless of the threshold voltage VthB of the TFT: M14.

The anode-cathode voltage of the organic EL element L1 after the initialization is (Vini−ELVSS). Given that a maximum value of the amount of variation of the anode voltage of the organic EL element L1 in the non-light emission period of the organic EL element L1 is ΔV, and a light emission threshold voltage of the organic EL element L1 is Vem, the initialization voltage Vini and the low-level power supply voltage ELVSS are determined to satisfy Relationship (2) below.

$$Vini - ELVSS + \Delta V < Vem \quad (2)$$

As a result, the organic EL element L1 is prevented from emitting faint light in the non-light emission period of the organic EL element L1, and the occurrence of the black floating can be prevented.

Figure 5:
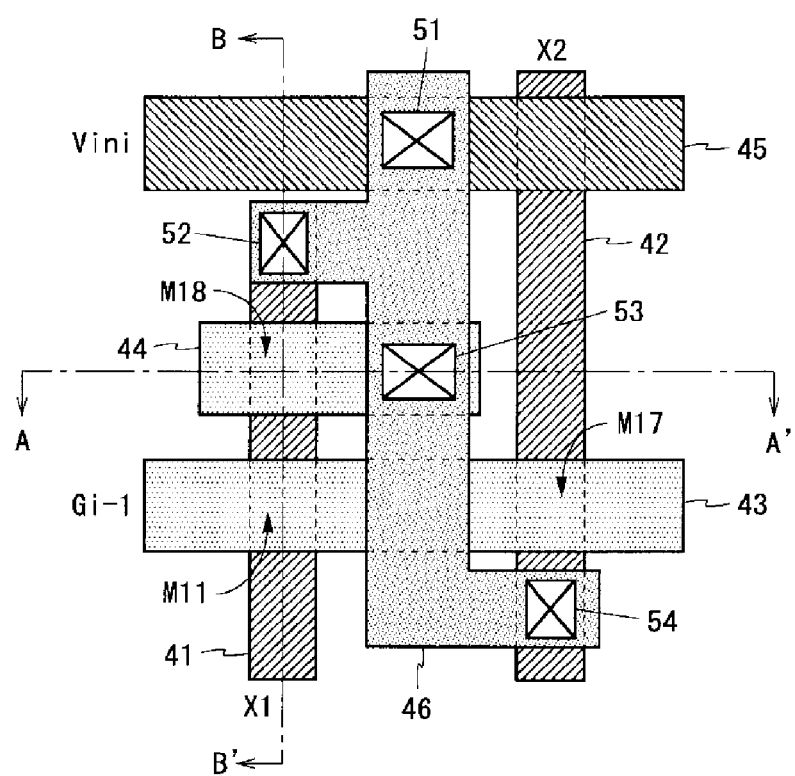
FIG. 5 is a layout diagram illustrating a part of the pixel circuit illustrated in FIG. 2.
Figure 6A:
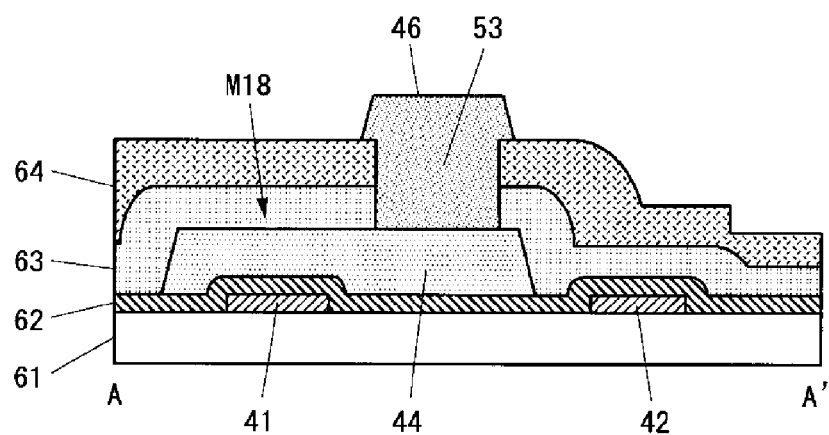
FIG. 6A is a cross-sectional view taken along line A-A' of FIG. 5.
Figure 6B:
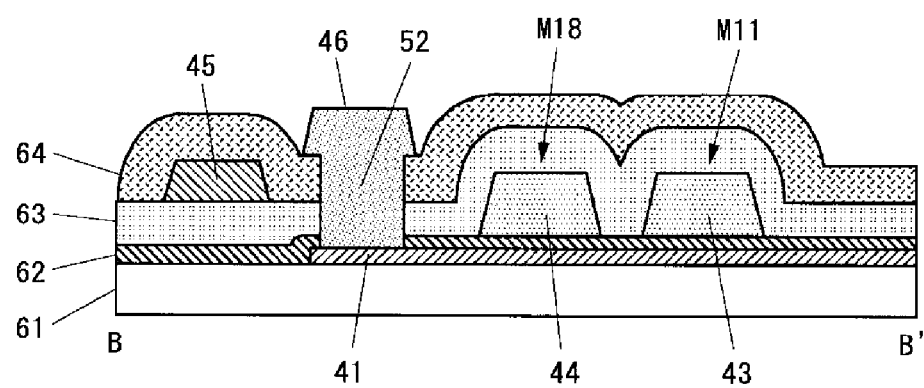
FIG. 6B is a cross-sectional view taken along line B-B' of FIG. 5.

FIG. 5 is a layout diagram illustrating a part of the pixel circuit 15. FIG. 6A is a cross-sectional view taken along line A-A' of FIG. 5, and FIG. 6B is a cross-sectional view taken along line B-B' of FIG. 5. FIG. 5 illustrates six wiring lines 41 to 46 and four contact holes 51 to 54. The wiring lines 41 and 42 are formed in a polysilicon wiring line layer, the wiring lines 43 and 44 are formed in a first metal wiring line layer, the wiring line 45 is formed in a second metal wiring line layer, and the wiring line 46 is formed in a third metal wiring line layer. As illustrated in FIG. 6A and FIG. 6B, the pixel circuit 15 is formed by sequentially layering the wiring line of the polysilicon wiring line layer, the gate insulating film 62, the wiring line of the first metal wiring line layer, the insulating film 63, the wiring line of the second metal wiring line layer, the insulating film 64, and the wiring line of the third metal wiring line layer in necessary positions on the substrate 61.

The contact hole 51 electrically connects the wiring line 45 formed in the second metal wiring line layer and the wiring line 46 formed in the third metal wiring line layer. The contact hole 52 electrically connects the wiring line 41 formed in the polysilicon wiring line layer and the wiring line 46 formed in the third metal wiring line layer. The contact hole 53 electrically connects the wiring line 44 formed in the first metal wiring line layer and the wiring line 46 formed in the third metal wiring line layer. The contact hole 54 electrically connects the wiring line 42 formed in the polysilicon wiring line layer and the wiring line 46 formed in the third metal wiring line layer.

The wiring line 43 is the scanning line Gi−1, and the wiring line 45 is the wiring line applied with the initialization voltage Vini. The X1 portion illustrated in FIG. 5 is connected to the gate terminal of the TFT: M14, and the X2 portion illustrated in FIG. 5 is connected to an anode terminal of an organic EL element L1 included in the pixel circuit 15 of an immediately upper row. The TFT: M11 is formed at a position where the wiring line 41 and the wiring line 43 intersect each other. The TFT: M18 is formed at a position where the wiring line 41 and the wiring line 44 intersect each other. The TFT: M17 included in the pixel circuit 15 of i−1 row (the pixel circuit 15 of an immediately upper row) is formed at a position where the wiring line 42 and the wiring line 43 intersect each other. Note that FIG. 5, FIG. 6A, and FIG. 6B illustrate examples of configurations of the TFTs included in the pixel circuit 15. The TFTs included in the pixel circuit 15 may have configurations other than that illustrated in FIG. 5, FIG. 6A, and FIG. 6B.

In the display device 10, the first conduction terminal of the TFT: M11 is connected to the gate terminal of the TFT: M14 (the drive transistor); the TFT: M18 is diode-connected, the drain terminal and the gate terminal of the TFT: M18 are applied with the initialization voltage Vini, and the source terminal of the TFT: M18 is connected to the second conduction terminal of the TFT: M11; and the gate terminal of the TFT: M11 is connected to the scanning line Gi−1. Thus, the TFTs: M11 and M18 are turned on in a horizontal interval immediately before a horizontal interval at which the pixel circuit 15 is written, and the gate terminal of the TFT: M14 is initialized by using the initialization voltage Vini. The source terminal of the TFT: M17 is connected to the anode terminal of the organic EL element L1, the drain terminal of the TFT: M17 is applied with the initialization voltage Vini, and the gate terminal of the TFT: M17 is connected to the scanning line Gi. Thus, the TFT: M17 is turned on in the horizontal interval at which the pixel circuit 15 is written, and the anode terminal of the organic EL element L1 is initialized by using the initialization voltage Vini. In the display device 10, the gate terminal of the TFT: M14 is initialized by turning on the TFTs: M11 and M18, the anode terminal of the organic EL element L1 is initialized by turning on the TFT: M17, and the data voltage according to the image signal VS is applied to the gate terminal of the TFT: M14 by driving the scanning line Gi and the data line Sj. As a result, an image according to the image signal VS can be displayed.

In the display device 10, the gate voltage of the TFT: M14 after the initialization is greater than the anode voltage of the organic EL element L1 after the initialization. The gate voltage of the TFT: M14 after the initialization is equal to the voltage (Vini+|VthA|) obtained by adding the absolute value of the threshold voltage VthA of the TFT: M18 to the initialization voltage Vini, and the anode voltage of the organic EL element L1 after the initialization is equal to the initialization voltage Vini.

Figure 11:
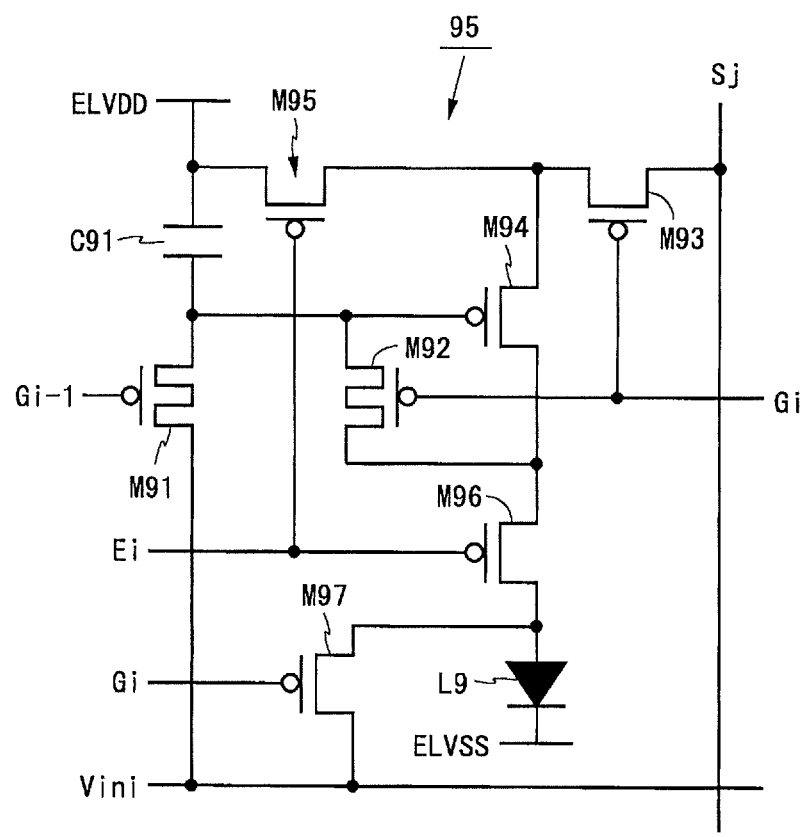
FIG. 11 is a circuit diagram of a pixel circuit of a known display device.
Figure 12:
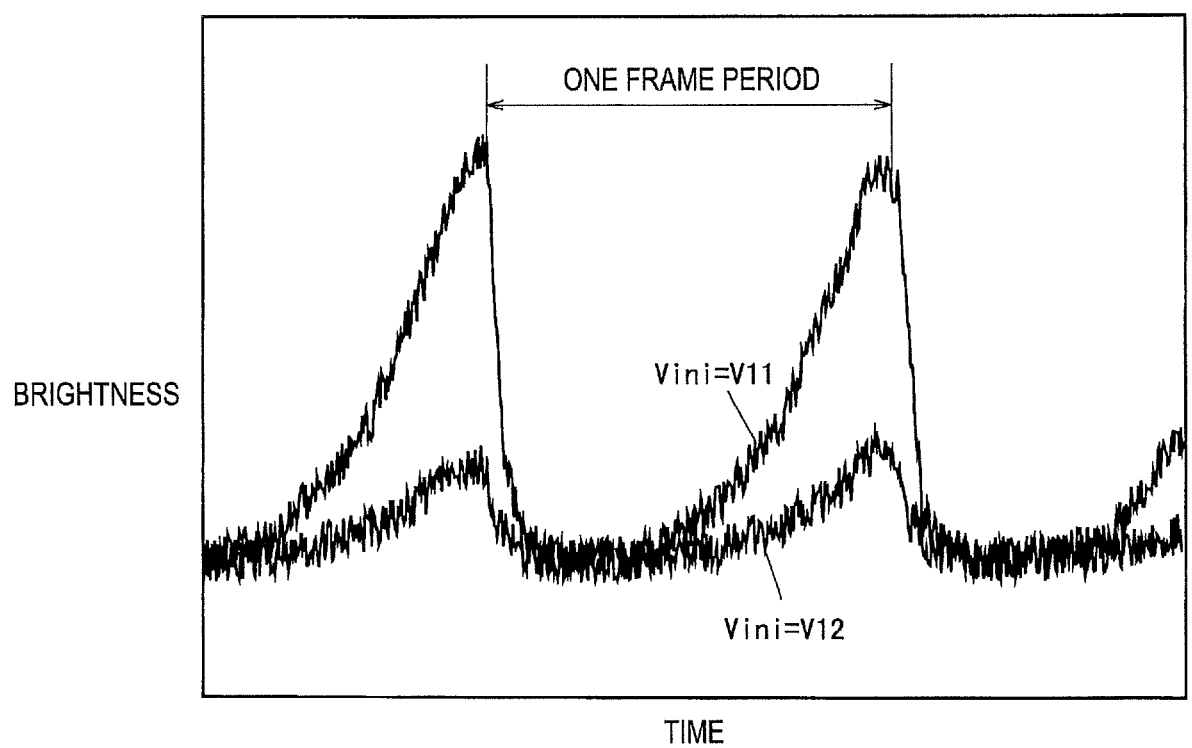
FIG. 12 is a diagram showing a measurement result of brightness near the bright spots in a known display device.
Figure 13:
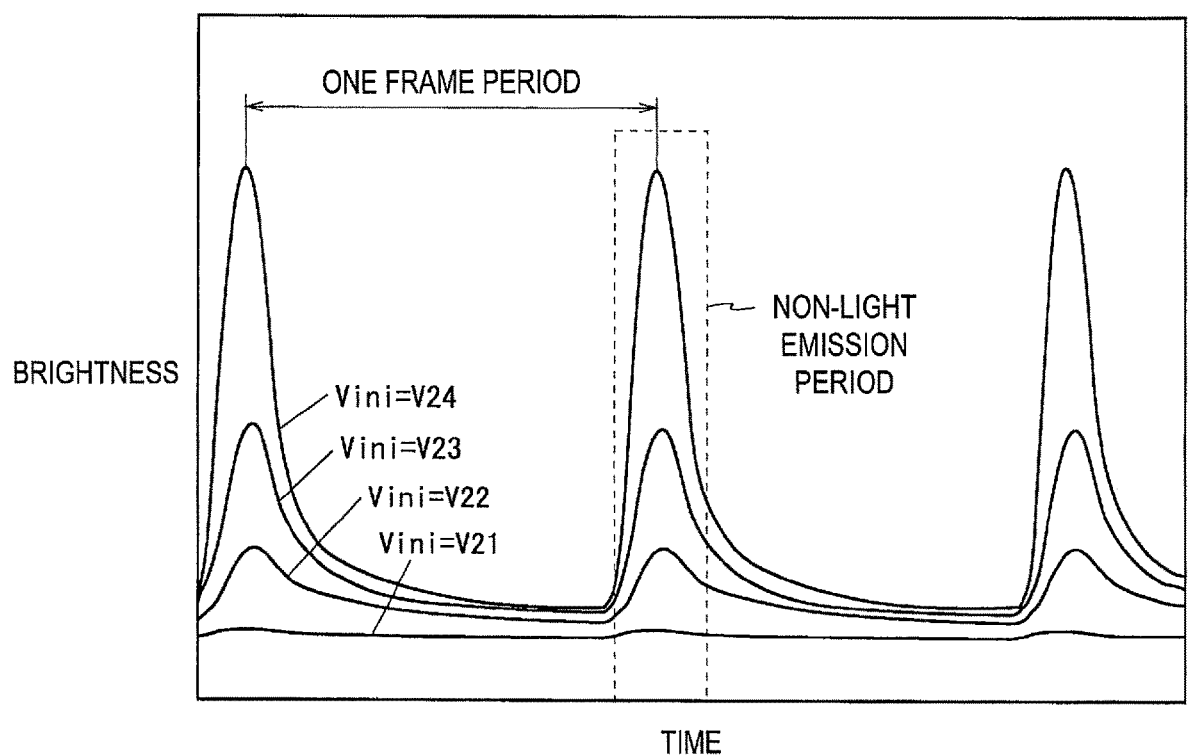
FIG. 13 is a diagram showing a measurement result of brightness of a pixel in a case where the black floating occurs in a known display device.

As described above, in the known display device including the pixel circuit 95 illustrated in FIG. 11, the gate terminal of the drive transistor (TFT: M94) and the anode terminal of the organic EL element L9 are initialized to the same voltage level by using the initialization voltage Vini. As a result, there is a problem in the known display device that depending on the initialization voltage Vini, either the bright points or the black floating is prone to occur.

In contrast, in the display device 10 according to the present embodiment, the gate voltage of the drive transistor (TFT: M14) is initialized to (Vini+|VthA|), and the anode voltage of the organic EL element L1 is initialized to Vini. In this way, the gate terminal of the drive transistor and the anode terminal of the organic EL element L1 are initialized to the different voltage levels. Thus, in a case where the threshold voltage VthA of the TFT: M18 is appropriately determined, the generation of the bright spots can be prevented by increasing the gate voltage of the TFT: M14 after the initialization, while the generation of the black floating can be prevented by lowering the anode voltage of the organic EL element L1 after the initialization.

As described above, according to the display device 10 according to the present embodiment, both the bright spots and the black floating can be suppressed by initializing the gate terminal of the drive transistor (TFT: M14) and the anode terminal of the electro-optical element (organic EL element L1) to the different voltage levels. The gate terminal of the drive transistor and the anode terminal of the electro-optical element are initialized by using the same wiring line (the wiring line having the initialization voltage Vini), and this can prevent the layout area of the display portion 11 from increasing.

Second Embodiment

Figure 7:
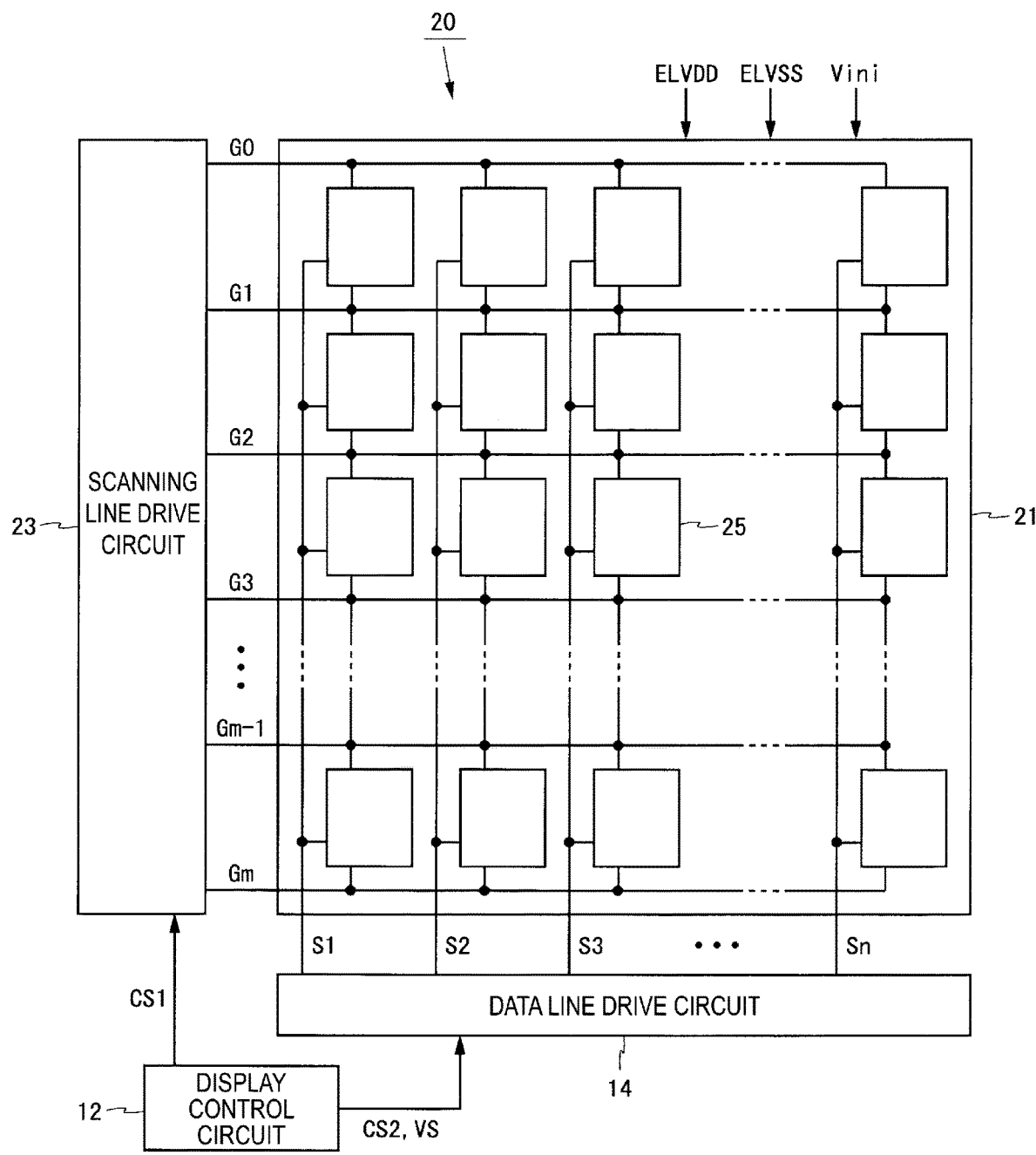
FIG. 7 is a block diagram illustrating a configuration of a display device according to a second embodiment.

FIG. 7 is a block diagram illustrating a configuration of a display device according to a second embodiment. A display device 20 illustrated in FIG. 7 includes a display portion 21, a display control circuit 12, a scanning line drive circuit 23, and a data line drive circuit 14. The same elements in the present embodiment as those in the first embodiment are denoted by the same reference signs, and the description thereof will be omitted.

The display portion 21 includes (m+1) scanning lines G0 to Gm, n data lines S1 to Sn, and (m×n) pixel circuits 25. The scanning lines G0 to Gm, the data lines S1 to Sn, and the (m×n) pixel circuits 25 are arranged in the same manner as the first embodiment. The pixel circuit 25 in the i-th row and j-th column is connected to two scanning lines Gi−1, Gi and a data line Sj. Similar to the first embodiment, each of the plurality of pixel circuits 25 is constantly supplied with the high-level power supply voltage ELVDD, the low-level power supply voltage ELVSS, and the initialization voltage Vini.

The scanning line drive circuit 23 drives the scanning lines G0 to Gm on the basis of the control signal CS1. The scanning line drive circuit 23 is a circuit in which the function of driving the light emission control lines E1 to Em is removed from the scanning line drive/light emission control circuit 13 according to the first embodiment.

Figure 8:
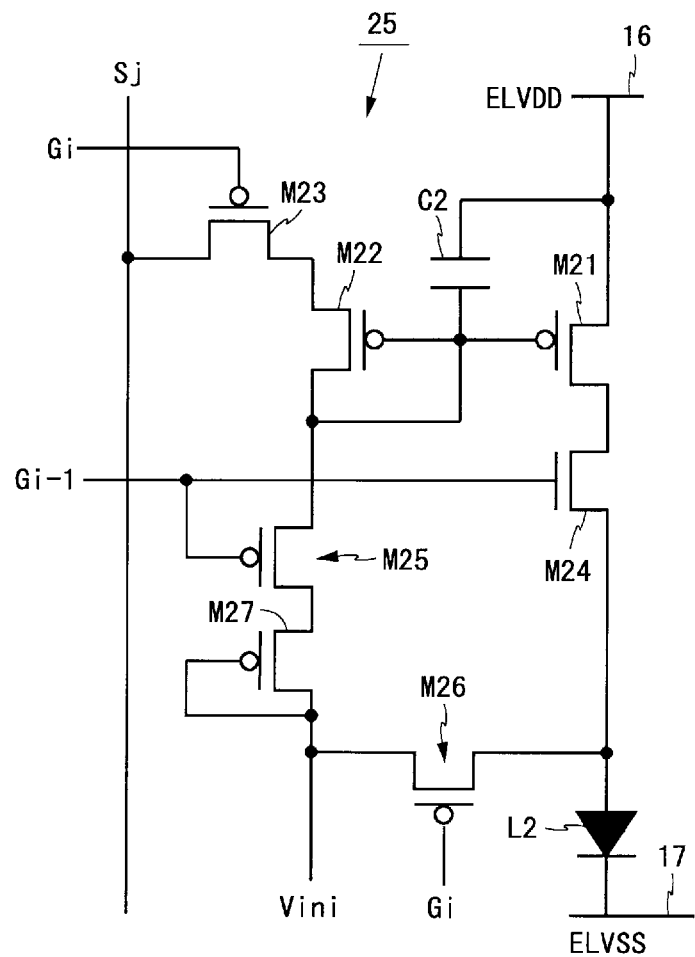
FIG. 8 is a circuit diagram illustrating a pixel circuit of the display device illustrated in FIG. 7.

FIG. 8 is a circuit diagram illustrating the pixel circuit 25. FIG. 8 illustrates a pixel circuit 25 in the i-th row and j-th column. The pixel circuit 25 illustrated in FIG. 8 includes seven TFTs: M21 to M27, an organic EL element L2, and a capacitor C2. The TFT: M24 is an N-channel transistor, and other TFTs are P-channel transistors.

A source terminal of the TFT: M21 and one electrode (an upper electrode in FIG. 8) of the capacitor C2 are connected to the first power source wiring line 16. A drain terminal of the TFT: M21 is connected to a drain terminal of the TFT: M24. A source terminal of the TFT: M24 is connected to an anode terminal of the organic EL element L2 and a source terminal of the TFT: M26. A cathode terminal of the organic EL element L2 is connected to the second power source wiring line 17. A first conduction terminal (a left terminal in FIG. 8) of the TFT: M23 is connected to the data line Sj. A second conduction terminal of the TFT: M23 is connected to a first conduction terminal (upper terminal in FIG. 8) of the TFT: M22. A gate terminal of the TFT: M21 is connected to the other electrode of the capacitor C2, a gate terminal of the TFT: M22, a second conduction terminal of the TFT: M22, and a first conduction terminal (upper terminal in FIG. 8) of the TFT: M25. A second conduction terminal of the TFT: M25 is connected to a source terminal of the TFT: M27. The initialization voltage Vini is applied to drain terminals of the TFTs: M26 and M27 and a gate terminal of the TFT: M27. Gate terminals of the TFTs: M23 and M26 are connected to the scanning line Gi. Gate terminals of the TFTs: M24 and M25 are connected to an immediately preceding scanning line Gi−1 selected during a horizontal interval before the scanning line Gi is selected. Since a drain terminal and the gate terminal of the TFT: M22 are connected to each other, the TFT: M22 is diode-connected. Since the drain terminal and the gate terminal of the TFT: M27 are connected to each other, the TFT: M27 is diode-connected. The TFT: M24 is turned on complementary to the TFT: M25.

In the pixel circuit 25, the organic EL element L2 is provided on a path connecting a first and a second conductive members (the first power source wiring line 16 and the second power source wiring line 17) for supplying a power supply voltage and functions as an electro-optical element that emits light at brightness according to a current flowing through the path. The TFT: M21 is provided in series with the electro-optical element on the path and functions as a drive transistor that controls the amount of current flowing through the path. The TFT: M26 functions as a first transistor that includes a first conduction terminal connected to the anode terminal of the electro-optical element, a second conduction terminal to which the initialization voltage Vini is applied, and a gate terminal connected to the scanning line Gi. The TFT: M25 functions as a second transistor that includes a first conduction terminal connected to the gate terminal of the drive transistor and a gate terminal connected to the immediately preceding scanning line Gi−1 selected in a horizontal interval immediately before the scanning line Gi is selected. The TFT: M27 is diode-connected and functions as a third transistor that includes a drain terminal and a gate terminal to which the initialization voltage Vini is applied and a source terminal connected to a second conduction terminal of the second transistor.

The TFT: M23 functions as a writing control transistor that includes a first conduction terminal connected to the data line Sj and the gate terminal connected to the scanning line Gi. The TFT: M22 functions as a threshold value compensation transistor that includes a first conduction terminal connected to a second conduction terminal of the writing control transistor, and includes a second conduction terminal and a gate terminal connected to a gate terminal of the drive transistor. The TFT: M24 functions as a fourth transistor that includes a first conduction terminal connected to the anode terminal of the electro-optical element, a second conduction terminal connected to a second conduction terminal of the drive transistor, and is complementarily conducted to the second transistor. The capacitor C2 is provided between the first conductive member and the gate terminal of the drive transistor. The first conduction terminal of the drive transistor is connected to the first conductive member, and a cathode terminal of the electro-optical element is connected to the second conductive member.

Figure 9:
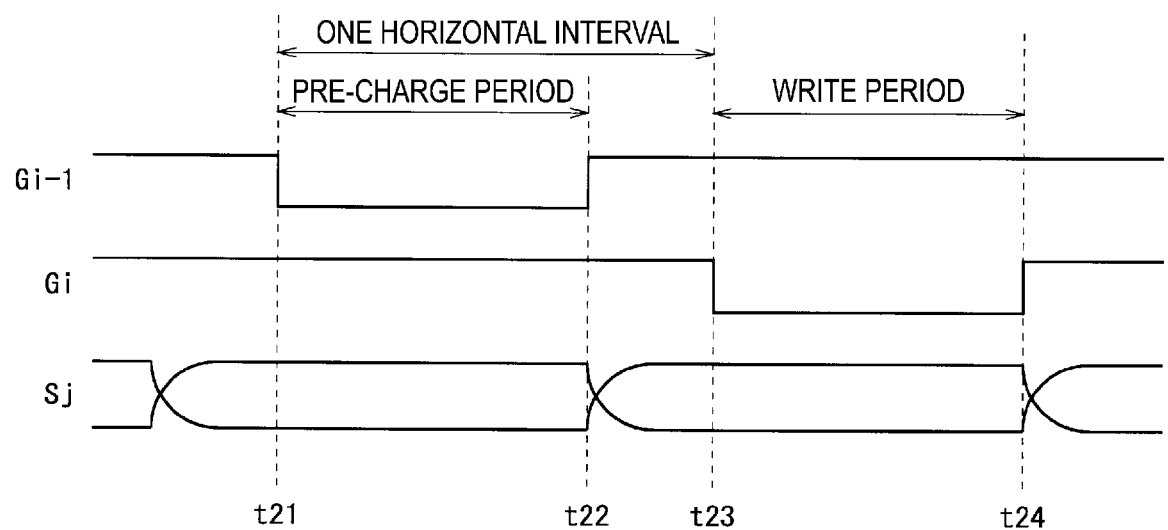
FIG. 9 is a timing chart of the display device illustrated in FIG. 7.

FIG. 9 is a timing chart of the display device 20. FIG. 9 illustrates a change in voltage when a data voltage is written to the pixel circuit 25 in the i-th row and j-th column. In FIG. 9, the period between times t21 and t22 is the pre-charge period of the pixel circuit 25 in the i-th row. The period between times t23 and t24 is the write period of the pixel circuit 25 in the i-th row. The pixel circuit 25 in the i-th row emits light in a period other than the pre-charge period.

Before the time t21, the scanning signals Gi−1 and Gi are at the high-level. Thus, the TFTs: M23, and M25 to M27 are in an off state, and the TFT: M24 is in an on state. At this time, in a case where a gate-source voltage of the TFT: M21 is less than or equal to a threshold voltage, a current flows from the first power source wiring line 16 toward the second power source wiring line 17 via the TFTs: M21, M24 and the organic EL element L2, and the organic EL element L2 emits light at brightness according to the amount of the flowing current.

At a time t21, the scanning signal Gi−1 is changed to the low-level. Accordingly, the TFT: M24 is turned off, the TFT: M25 is turned on, and the TFT: M27 is also turned on. Thus, at and after the time t21, since the TFT: M24 is turned off, no current flows via the organic EL element L2, and the organic EL element L2 is brought into a non-emitting state. Since the TFTs: M25 and M27 are turned on, the gate terminal of the TFT: M21 is initialized by using the initialization voltage Vini. Given that the threshold voltage of the TFT: M21 is VthC (<0), a gate voltage of the TFT: M21 after the initialization is (Vini+|VthC|). The initialization voltage Vini is set at a lower level such that the TFT: M21 is turned on immediately after the scanning signal Gi is changed to the low-level (immediately after the time t23).

Next, at the time t22, the scanning signal Gi−1 is changed to the high-level. Accordingly, the TFT: M24 is turned on, the TFT: M25 is turned off, and the TFT: M27 is also turned off. At the time t22, the initialization of the gate terminal of the TFT: M21 terminates. Further, in a similar manner to the period before the time t21, in a case where a gate-source voltage of the TFT: M21 is less than or equal to a threshold voltage, a current flows via the organic EL element L2, and the organic EL element L2 emits light.

Next, at the time t23, the scanning signal Gi is changed to the low-level. Accordingly, the TFTs: M23 and M26 are turned on. Since the TFTs: M23 is turned on, a current flows from the data line Sj toward a gate terminal of the TFT: M22 via the TFTs: M23 and M22. The gate voltages of the TFTs: M21 and M22 rise due to this current. In a case where a gate-source voltage of the TFT: M22 is equal to a threshold voltage of the TFT: M22, no current flows. Given that a threshold voltage of the TFT: M21 is Vth1 (<0), a threshold voltage of the TFT: M22 is Vth2 (<0), and a data voltage applied to the data line Sj in a period from the time t23 to the time t24 is Vd, a gate voltage of the TFTs: M21 and M22 after a lapse of sufficient time from the time t23 is (Vd−|Vth2|). Since the TFT: M26 is turned on, the anode terminal of the organic EL element L2 is initialized by using the initialization voltage Vini. The anode voltage of the organic EL element L2 after the initialization is Vini.

Next, at the time t24, the scanning signal Gi is changed to the high-level. Accordingly, the TFTs: M23 and M26 are turned off. At and after the time t24, the capacitor C2 holds an inter-electrode voltage (ELVDD−Vd+|Vth2|). A current flows from the first power source wiring line 16 toward the second power source wiring line 17 via the TFTs: M21, M24 and the organic EL element L2. A gate-source voltage Vgs of the TFT: M21 is held at (ELVDD−Vd+|Vth2|) by action of the capacitor C2. The current Ie flowing at and after the time t24 is, therefore, given by Equation (3) below by using a constant K.

$$Ie = K(Vgs - |Vth1|)^2 \qquad (3)$$
$$= K(ELVDD - Vd + |Vth2| - |Vth1|)^2$$

In a case in which the threshold voltage Vth1 of the TFT: M21 and the threshold voltage Vth2 of the TFT: M22 are equal, Equation (4) below is derived from Equation (3).

$$Ie = K(ELVDD - Vd)^2 \qquad (4)$$

In this way, at and after the time t24, the organic EL element L2 emits light at brightness according to the data voltage Vd written to the pixel circuit 25 regardless of the threshold voltage Vth1 of the TFT: M21. In the display device 20 as well, similar to the first embodiment, the initialization voltage Vini and the low-level power supply voltage ELVSS are determined to satisfy Relationship (2).

In the display device 20, the first conduction terminal of the TFT: M25 is connected to the gate terminal of the TFT: M21 (drive transistor); the TFT: M27 is diode-connected, the drain terminal and the gate terminal of the TFT: M27 are applied with the initialization voltage Vini, and the source terminal of the TFT: M27 is connected to a second conduction terminal of the TFT: M25; and the gate terminal of the TFT: M25 is connected to the scanning line Gi−1. Thus, the TFTs: M25 and M27 are turned on in a horizontal interval immediately before a horizontal interval at which the pixel circuit 25 is written, and the gate terminal of the TFT: M21 is initialized by using the initialization voltage Vini. The gate voltage of the TFT: M21 after the initialization is (Vini+|VthC|). The source terminal of the TFT: M26 is connected to the anode terminal of the organic EL element L2, the drain terminal of the TFT: M26 is applied with the initialization voltage Vini, and the gate terminal of the TFT: M26 is connected to the scanning line Gi. Thus, the TFT: M26 is turned on in a horizontal interval at which the pixel circuit 25 is written, and the anode terminal of the organic EL element L2 is initialized by using the initialization voltage Vini. The anode voltage of the organic EL element L2 after the initialization is Vini. In the display device 20, the gate terminal of the TFT: M21 is initialized by turning on the TFTs: M25 and M27, the anode terminal of the organic EL element L2 is initialized by turning on the TFT: M26, and the data voltage Vd according to the image signal VS is applied to the gate terminal of the TFT: M21 by driving the scanning line Gi and the data line Sj. As a result, an image according to the image signal VS can be displayed.

In the display device 20 according to the present embodiment, the gate voltage of the drive transistor (TFT: M21) is initialized to (Vini+|VthC|), and the anode voltage of the organic EL element L2 is initialized to Vini. In this way, the gate terminal of the drive transistor and the anode terminal of the organic EL element L2 are initialized to the different voltage levels. Thus, in a case where the threshold voltage VthC of the TFT: M27 is appropriately determined, the generation of the bright spots can be prevented by increasing the gate voltage of the TFT: M24 after the initialization, while the generation of the black floating can be prevented by lowering the anode voltage of the organic EL element L2 after the initialization.

As described above, according to the display device 20 according to the present embodiment, similar to the first embodiment, both the bright spots and the black floating can be suppressed by initializing the gate terminal of the drive transistor (TFT: M21) and the anode terminal of the electro-optical element (organic EL element L2) to the different voltage levels. The gate terminal of the drive transistor and the anode terminal of the electro-optical element are initialized by using the same wiring line (the wiring line applied with the initialization voltage Vini), and this can prevent the layout area of the display portion 21 from increasing.

Third Embodiment

Figure 10:
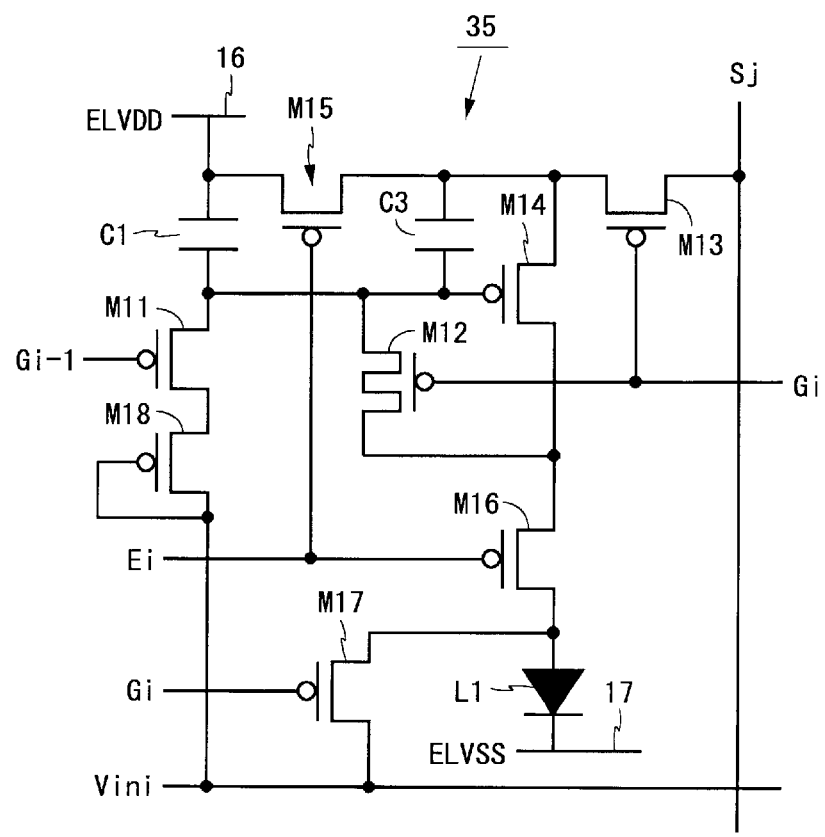
FIG. 10 is a circuit diagram of a pixel circuit of a display device according to a third embodiment.

A display device according to a third embodiment has the same configuration as that of the display device according to the first embodiment (refer to FIG. 1). The display device according to the present embodiment, however, includes a pixel circuit 35 illustrated in FIG. 10 instead of the pixel circuit 15. The pixel circuit 35 illustrated in FIG. 10 is a pixel circuit in which a capacitor C3 is added to the pixel circuit 15 according to the first embodiment. The capacitor C3 is provided between the source terminal and the gate terminal of the TFT: M14 and functions as a holding capacitor.

In general, in a case where a current flows through a power source wiring line having a resistance component, the power supply voltage is lowered (IR drop). In the display device according to the present embodiment, in a case where the high-level power supply voltage ELVDD is lowered by the IR drop, the source voltage of the TFT: M14 is also lowered. Since the source terminal and the gate terminal of the TFT: M14 are connected to each other with the capacitor C3 therebetween, in a case where the source voltage of the TFT: M14 is lowered, the gate voltage of the TFT: M14 is also lowered by the action of the capacitor C3. Thus, the effect of the IR drop on the first power source wiring line 16 can be mitigated.

In the display device according to the present embodiment, the pixel circuit 35 includes a capacitor C3 provided between the first conduction terminal (the source terminal of the TFT: M14) and the gate terminal of the drive transistor. According to the display device according to the present embodiment, the effect of the IR drop on the first power source wiring line 16 can be mitigated.

As described above, the organic EL display device including the pixel circuit including the organic EL element (organic light emitting diode) is described as an example of a display device including a pixel circuit including an electro-optical element, but an inorganic EL display device including a pixel circuit including an inorganic light emitting diode and a Quantum-dot Light Emitting Diode (QLED) display device including a pixel circuit including a QLED may be configured by a similar method.

REFERENCE SIGNS LIST 10, 20 Display device
11, 21 Display portion
12 Display control circuit
13 Scanning line drive/light emission control circuit
14 Data line drive circuit 15, 25, 35 Pixel Circuit
16 First power source wiring line
17 Second power source wiring line
23 Scanning line drive circuit

The invention claimed is:

1. A display device, comprising:
a display portion including a plurality of scanning lines, a plurality of data lines, and a plurality of pixel circuits two-dimensionally arranged;
a scanning line drive circuit configured to drive the plurality of scanning lines; and
a data line drive circuit configured to drive the plurality of data lines,
wherein each of the plurality of pixel circuits includes
an electro-optical element provided on a path connecting a first conductive member and a second conductive member for supplying a power supply voltage and configured to emit light at brightness according to a current flowing through the path,
a drive transistor provided in series with the electro-optical element on the path and configured to control the amount of current flowing through the path,
a first transistor including a first conduction terminal connected to an anode terminal of the electro-optical element, a second conduction terminal to which an initialization voltage is applied, and a gate terminal connected to a scanning line of the plurality of scanning lines,
a second transistor including a first conduction terminal connected to a gate terminal of the drive transistor and a gate terminal connected to an immediately preceding scanning line selected in a horizontal interval immediately before the scanning line is selected, and
a third transistor being diode-connected, and including a drain terminal and a gate terminal to which the initialization voltage is applied, and a source terminal connected to a second conduction terminal of the second transistor.

2. The display device according to claim 1,
wherein the display portion further includes a plurality of light emission control lines,
each of the plurality of pixel circuits further includes
a writing control transistor including a first conduction terminal connected to a data line of the plurality of data lines, a second conduction terminal connected to a first conduction terminal of the drive transistor, and a gate terminal connected to the scanning line,
a threshold value compensation transistor including a first conduction terminal connected to a second conduction terminal of the drive transistor, a second conduction terminal connected to the gate terminal of the drive transistor, and a gate terminal connected to the scanning line,
a first light emission control transistor including a first conduction terminal connected to the first conductive member, a second conduction terminal connected to the first conduction terminal of the drive transistor, and a gate terminal connected to a light emission control line of the plurality of light emission control lines,
a second light emission control transistor including a first conduction terminal connected to the second conduction terminal of the drive transistor, a second conduction terminal connected to the anode terminal of the electro-optical element, and a gate terminal connected to the light emission control line, and
a capacitor provided between the first conductive member and the gate terminal of the drive transistor, and
the electro-optical element includes a cathode terminal connected to the second conductive member.

3. The display device according to claim 2,
wherein each of the plurality of pixel circuits further includes a capacitor provided between the first conduction terminal and the gate terminal of the drive transistor.

4. The display device according to claim 2,
wherein a gate voltage of the drive transistor after initialization is greater than an anode voltage of the electro-optical element after the initialization.

5. The display device according to claim 4,
wherein the gate voltage of the drive transistor after the initialization is equal to a voltage obtained by adding an absolute value of a threshold voltage of the third transistor to the initialization voltage, and
the anode voltage of the electro-optical element after the initialization is equal to the initialization voltage.

6. The display device according to claim 1,
wherein each of the plurality of pixel circuits further includes
a writing control transistor including a first conduction terminal connected to a data line of the plurality of data lines and a gate terminal connected to the scanning line,
a threshold value compensation transistor including a first conduction terminal connected to a second conduction terminal of the writing control transistor, and a second conduction terminal and a gate terminal connected to the gate terminal of the drive transistor,
a fourth transistor including a first conduction terminal connected to the anode terminal of the electro-optical element, a second conduction terminal connected to a second conduction terminal of the drive transistor, and being complementarily conducted to the second transistor, and
a capacitor provided between the first conductive member and the gate terminal of the drive transistor,
the drive transistor includes a first conduction terminal connected to the first conductive member, and
the electro-optical element includes a cathode terminal connected to the second conductive member.

7. The display device according to claim 1,
wherein the second transistor and the third transistor are turned on in a case where a low-level voltage is applied to the gate terminal of the second transistor, and
the gate terminal of the drive transistor is initialized by using the initialization voltage.

8. The display device according to claim 7,
wherein the third transistor is a P-channel transistor.

9. The display device according to claim 8,
wherein Relationship (a) below is satisfied,
where the initialization voltage is Vini, a voltage of the second conductive member is ELVSS, a maximum value of the amount of variation of the anode voltage of the electro-optical element in a non-light emission period of the electro-optical element is ΔV, and a light emission threshold voltage of the electro-optical element is Vem, $$Vini-ELVSS+\Delta V < Vem \tag{a}$$

10. The display device according to claim 1,
wherein the electro-optical element is any one of an organic light emitting diode, an inorganic light emitting diode, or a quantum dot light emitting diode.

11. A method for driving a display device including a display portion including a plurality of scanning lines, a plurality of data lines, and a plurality of pixel circuits two-dimensionally arranged, the method comprising:

in a case where each of the plurality of pixel circuits includes an electro-optical element provided on a path connecting a first conductive member and a second conductive member for supplying a power supply voltage and configured to emit light at brightness according to a current flowing through the path, a drive transistor provided in series with the electro-optical element on the path and configured to control the amount of current flowing through the path, a first transistor including a first conduction terminal connected to an anode terminal of the electro-optical element, a second conduction terminal to which an initialization voltage is applied, and a gate terminal connected to a scanning line of the plurality of scanning lines, a second transistor including a first conduction terminal connected to a gate terminal of the drive transistor and a gate terminal connected to an immediately preceding scanning line selected in a horizontal interval immediately before the scanning line is selected, and a third transistor being diode-connected, and including a drain terminal and a gate terminal to which the initialization voltage is applied, and a source terminal connected to a second conduction terminal of the second transistor, initializing the gate terminal of the drive transistor by turning on the second and third transistors;

initializing the anode terminal of the electro-optical element by turning on the first transistor; and applying a voltage according to an image signal to the gate terminal of the drive transistor by driving the scanning line and a data line of the plurality of the data lines.

12. The method for driving a display device according to claim 11, wherein the display portion further includes a plurality of light emission control lines, each of the plurality of pixel circuits further includes a writing control transistor including a first conduction terminal connected to the data line, a second conduction terminal connected to a first conduction terminal of the drive transistor, and a gate terminal connected to the scanning line, a threshold value compensation transistor including a first conduction terminal connected to a second conduction terminal of the drive transistor, a second conduction terminal connected to the gate terminal of the drive transistor, and a gate terminal connected to the scanning line, a first light emission control transistor including a first conduction terminal connected to the first conductive member, a second conduction terminal connected to the first conduction terminal of the drive transistor, and a gate terminal connected to a light emission control line of the plurality of light emission control lines, a second light emission control transistor including a first conduction terminal connected to the second conduction terminal of the drive transistor, a second conduction terminal connected to the anode terminal of the electro-optical element, and a gate terminal connected to the light emission control line, and a capacitor provided between the first conductive member and the gate terminal of the drive transistor, and the electro-optical element includes a cathode terminal connected to the second conductive member, the initializing of the gate terminal of the drive transistor is performed in a horizontal interval immediately before a horizontal interval at which the plurality of pixel circuits are written, and the initializing of the anode terminal of the electro-optical element is performed in a horizontal interval at which the plurality of pixel circuits are written.

13. The method for driving a display device according to claim 12, wherein each of the plurality of pixel circuits further includes a capacitor provided between the first conduction terminal and the gate terminal of the drive transistor.

14. The method for driving a display device according to claim 12, wherein a gate voltage of the drive transistor after initialization is greater than an anode voltage of the electro-optical element after the initialization.

15. The method for driving a display device according to claim 14, wherein the gate voltage of the drive transistor after the initialization is equal to a voltage obtained by adding an absolute value of a threshold voltage of the third transistor to the initialization voltage, and the anode voltage of the electro-optical element after the initialization is equal to the initialization voltage.

16. The method for driving a display device according to claim 11, wherein each of the plurality of pixel circuits further includes, a writing control transistor including a first conduction terminal connected to the data line and a gate terminal connected to the scanning line, a threshold value compensation transistor including a first conduction terminal connected to a second conduction terminal of the writing control transistor and a second conduction terminal and a gate terminal connected to the gate terminal of the drive transistor, a fourth transistor including a first conduction terminal connected to the anode terminal of the electro-optical element, a second conduction terminal connected to a second conduction terminal of the drive transistor, and being complementarily conducted to the second transistor, and a capacitor provided between the first conductive member and the gate terminal of the drive transistor, the drive transistor includes a first conduction terminal connected to the first conductive member, the electro-optical element includes a cathode terminal connected to the second conductive member, the initializing of the gate terminal of the drive transistor is performed in a horizontal interval immediately before a horizontal interval at which the plurality of pixel circuits are written; and the initializing of the anode terminal of the electro-optical element is performed in the horizontal interval at which the plurality of pixel circuits are written.

17. The method for driving a display device according to claim 11, wherein the second and third transistors are turned on in a case where a low-level voltage is applied to the gate terminal of the second transistor, and the gate terminal of the drive transistor is initialized by using the initialization voltage.

18. The method for driving a display device according to claim 17,
wherein the third transistor is a P-channel transistor.

19. The method for driving a display device according to claim 18,
wherein Relationship (b) below is satisfied,
where the initialization voltage is Vini, a voltage of the second conductive member is ELVSS, a maximum value of the amount of variation of an anode voltage of the electro-optical element in a non-light emission period of the electro-optical element is ΔV, and the light emission threshold voltage of the electro-optical element is Vem, $$Vini-ELVSS+\Delta V < Vem \qquad (b).$$

20. The method for driving a display device according to claim 11,
wherein the electro-optical element is any one of an organic light emitting diode, an inorganic light emitting diode, or a quantum dot light emitting diode.

\* \* \* \* \*